(12) United States Patent
Jeung

(10) Patent No.: US 6,839,295 B1
(45) Date of Patent: Jan. 4, 2005

(54) SEMICONDUCTOR MEMORY DEVICE AND METHOD OF READING DATA FROM THE SEMICONDUCTOR MEMORY DEVICE

(75) Inventor: Seong-Ho Jeung, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/753,371

(22) Filed: Jan. 9, 2004

(30) Foreign Application Priority Data

Jun. 18, 2003 (KR) .................................. 10-2003-0039353

(51) Int. Cl.[7] ............................................... G11C 7/00
(52) U.S. Cl. ..................................... 365/203; 365/210
(58) Field of Search .............................. 365/203, 205, 365/207, 208, 210

(56) References Cited

U.S. PATENT DOCUMENTS

| | | | | |
|---|---|---|---|---|
| 5,241,497 A | * | 8/1993 | Komarek ..................... 365/203 |
| 6,229,746 B1 | * | 5/2001 | Tooher ........................ 365/210 |
| 6,490,214 B2 | * | 12/2002 | Kawasumi .................. 365/210 |
| 6,577,548 B1 | * | 6/2003 | Barth et al. ................. 365/210 |
| 6,674,668 B2 | * | 1/2004 | Ikehashi et al. ............ 365/205 |
| 6,717,877 B2 | * | 4/2004 | Suzuki et al. ............... 365/210 |

* cited by examiner

Primary Examiner—Trong Phan
(74) Attorney, Agent, or Firm—Harness Dickey

(57) ABSTRACT

A semiconductor memory device and method of reading data from the semiconductor memory device is described. The semiconductor memory device may generate a data read clock signal that changes from a first logic state to a second logic state, and may read out bit cell data from a plurality of bit lines based on the generated data read clock signal. A word line signal and a dummy word line signal may be activated from the first logic state to the second logic state based on incoming X-address signals and Y-address signals. An enable signal may be output based on the activated dummy word signal, and a sense amplifier may sense the read-out bit cell data and a reference signal based on the activated enable signal, and output a corresponding to the sensed read-out bit cell data.

20 Claims, 6 Drawing Sheets

SEMICONDUCTOR MEMORY DEVICE AND METHOD OF READING DATA FROM THE SEMICONDUCTOR MEMORY DEVICE

PRIORITY STATEMENT

This application claims the priority of Korean Patent Application No. 2003-39353, filed on Jun. 18, 2003, in the Korean Intellectual Property Office, the disclosure of which is incorporated herein in its entirety by reference.

BACKGROUND OF THE INVENTION

1. Field of the Invention

The present invention relates to a semiconductor memory device, and a method of reading data from the semiconductor memory device.

2. Description of the Related Art

FIG. 1 is a circuit diagram of a cell array structure of a conventional ROM. The conventional ROM has a capacity of 1 M (1024×1024). The conventional ROM of FIG. 1 includes a bit cell array unit 110, a reference cell array unit 120 and a bit cell replica array unit 130, and is disclosed in U.S. Pat. No. 6,404,666.

In FIG. 1, the bit cells M0 to M15 (represented by transistors) of bit cell array unit 110 store bit cell information, i.e., store either logic low data "0" or logic high data "1" depending on whether the bit cells are coupled to virtual ground lines (lines for VGND0, VGND1, VGND2, . . . ). In other words, the drains of the transistors in bit cell array unit 110 are coupled to bit lines (lines for signals DBIT0, DBIT1, . . . ), and the sources thereof are either coupled to the virtual ground lines (see M13, M15, etc.) or open (see M1, M2, etc.). If the sources of the transistors are coupled to the virtual ground lines, logic low data (a "0") is stored in the cells. Alternatively, if the sources are open, logic high data (a "1") is stored in the cells. For example, bit cells M12, M13, M14, and M15 store "1", "0", "1", and "0", respectively.

Upon reading of data from bit cells, one of the virtual ground lines (lines for VGND0, VGND1, VGND2, etc.) and one of the bit lines DBIT0, DBIT1, etc. are selected in response to a ROM Y-address signal. The selected virtual ground line is provided with a ground voltage. Hence, if the sources of the transistors of the bit cell array unit 110 are coupled to the virtual ground lines, the bit lines in a pre-charged state are also discharged to a ground state and output data "0". Additionally, one of a plurality of word lines (lines for signals VWL0, VWL1, . . . , VWL1022, and VWL 1023) is selected according to an ROM X-address signal, and the selected word line is provided with a "1".

As one of transistors M28 through M31 is turned on by a word line turning to "1" in response to a predetermined data read clock, the bit cell replica array unit 130 receives a signal DUMVGND, which is supplied as a virtual ground voltage, and outputs a signal VDUMBIT as an enable signal of a sense amplifier (not shown).

The reference cell array unit 120 generates a reference signal which is compared with data "0" or "1" stored in the bit cells of the sense amplifier. The transistors constituting the reference cell array unit 120 have sources respectively coupled to reference signal lines REFVGND0, REFVGND1, . . . If reference signal lines are separated at an interval of 128 bit lines, the sources of the transistors of the reference cell array unit 120 are respectively coupled to reference signal lines REFVGND0 through REFVGND7. In this case, a selected reference signal, that is, one of reference signals REFBIT0 through REFBIT7, is set to have an intermediate level ranging in between "0" and "1" by a predetermined source controlled logic, and the selected reference signal with the intermediate level is output.

However, for the ROM structure of FIG. 1, since the transistors of the bit cell array unit 110 have process variations, the transistors of the reference cell array unit 120 for discharging the reference signal lines REFVGND0 through REFVGND7 have even greater process variations than those of bit cell array unit 110. These process variations in the transistors of the reference cell array unit 120 has an adverse effect on errors generated during or upon a data reading operation. In other words, if the transistors of the reference cell array unit 120 provide poor uniformity, the reference signals become unstable, and accordingly, the sense amplifier cannot perform a proper comparison with respect to the data stored in the bit cells. Therefore, the error rate of read-out data increases. Further, process variations in the transistors of the bit cell replica array unit 130 destabilize the generation of the enable signal for the sense amplifier, thus greatly affecting the error rate of read-out data.

SUMMARY OF THE INVENTION

An exemplary embodiment of the present invention is directed to a semiconductor memory device. The semiconductor memory device may include a precharging unit for charging a plurality of bit lines, a plurality of reference lines, a plurality of discharge lines and an enable line, and a dummy word line unit for discharging the discharge lines and the enable line to a first logic state. A bit cell array unit may store bit cell data and may read out the stored bit cell data, and a reference cell array unit may output a precharge voltage to charge a selected reference line. The semiconductor memory device may include a bit cell replica array unit for outputting the state of a signal transferred to the enable line, and an enable signal generation unit for checking the state of the enable signal to output the enable signal. Further a sense amplifying unit may sense the read-out bit cell data when the enable signal is activated, compare the read-out bit cell data with the reference signal, and output a logic state corresponding to the read-out bit cell data.

Another exemplary embodiment of the present invention is directed to a method of reading out data from the semiconductor memory device. The semiconductor memory device may generate a data read clock signal that changes from a first logic state to a second logic state, and may read out bit cell data from a plurality of bit lines based on the generated data read clock signal. A word line signal and a dummy word line signal may be activated from the first logic state to the second logic state based on incoming X-address signals and Y-address signals. An enable signal may be output based on the activated dummy word signal, and a sense amplifier may sense the read-out bit cell data and a reference signal based on the activated enable signal, and output a corresponding to the sensed read-out bit cell data.

BRIEF DESCRIPTION OF THE DRAWINGS

Exemplary embodiments of the present invention will become more fully understood from the detailed description herein below and the accompanying drawings, wherein like elements are represented by like reference numerals, which are by way of illustration only and thus do not limit the exemplary embodiments of the present invention and wherein.

DETAILED DESCRIPTION OF THE EXEMPLARY EMBODIMENTS

Figure 1:
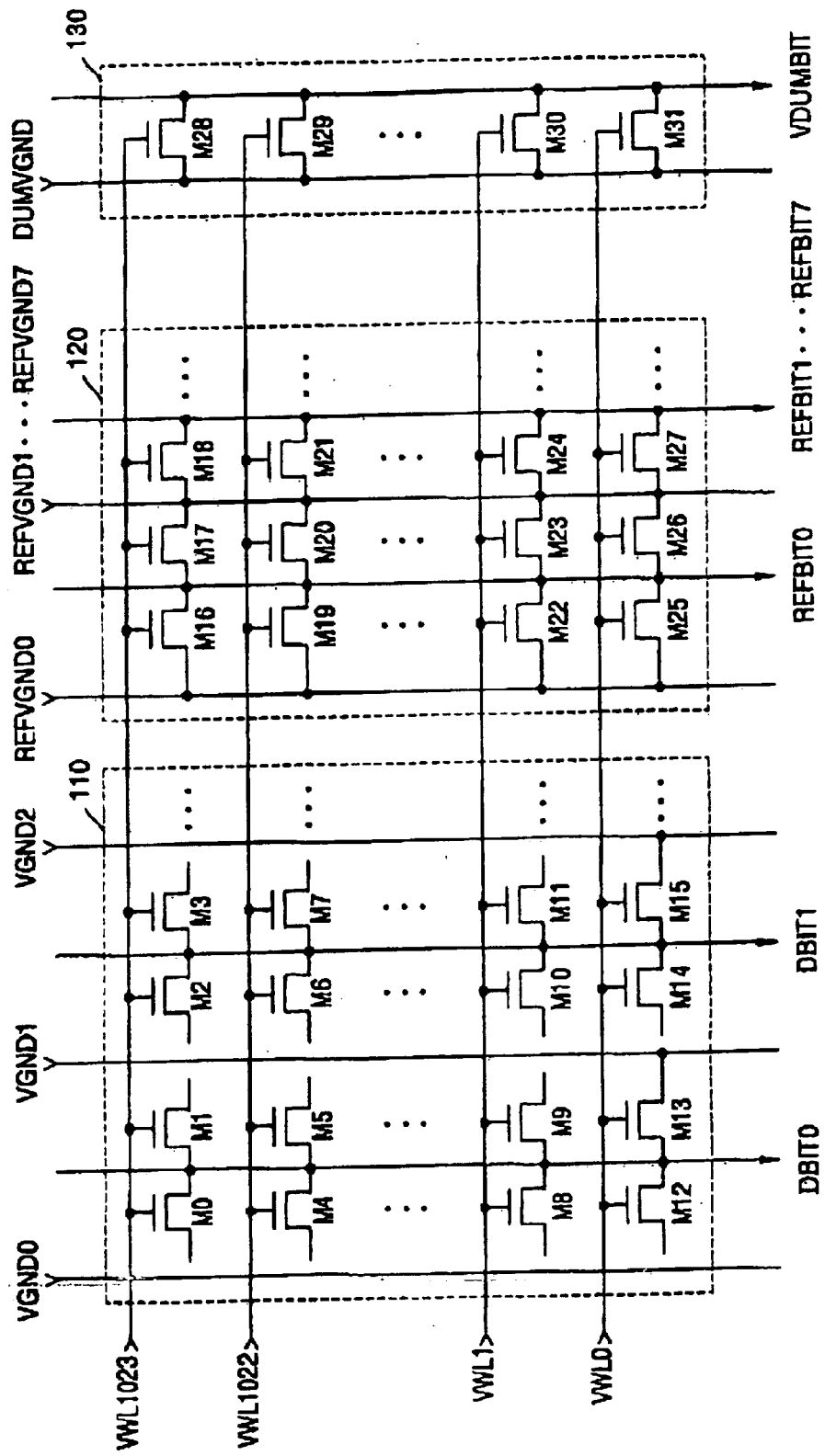
FIG. 1 is a circuit diagram of a cell array structure of a conventional read-only memory (ROM).

The present invention will now be described more fully with reference to the accompanying drawings, in which exemplary embodiments of the invention are shown. The exemplary embodiments are provided in order to more completely explain the present invention to anyone skilled in the art. In the drawings, the same reference numerals denote the same member.

Figure 2:
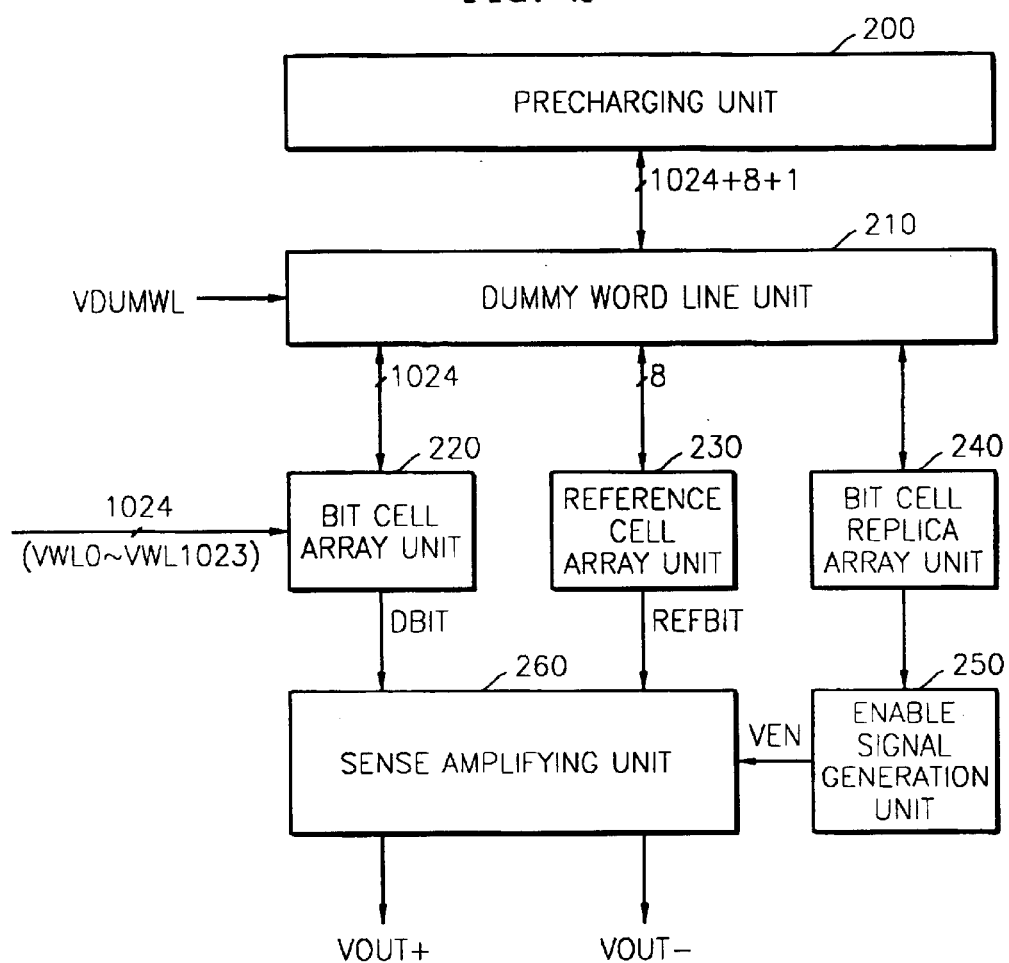
FIG. 2 is a block diagram of a semiconductor memory device according to an exemplary embodiment of the present invention.
Figure 3:
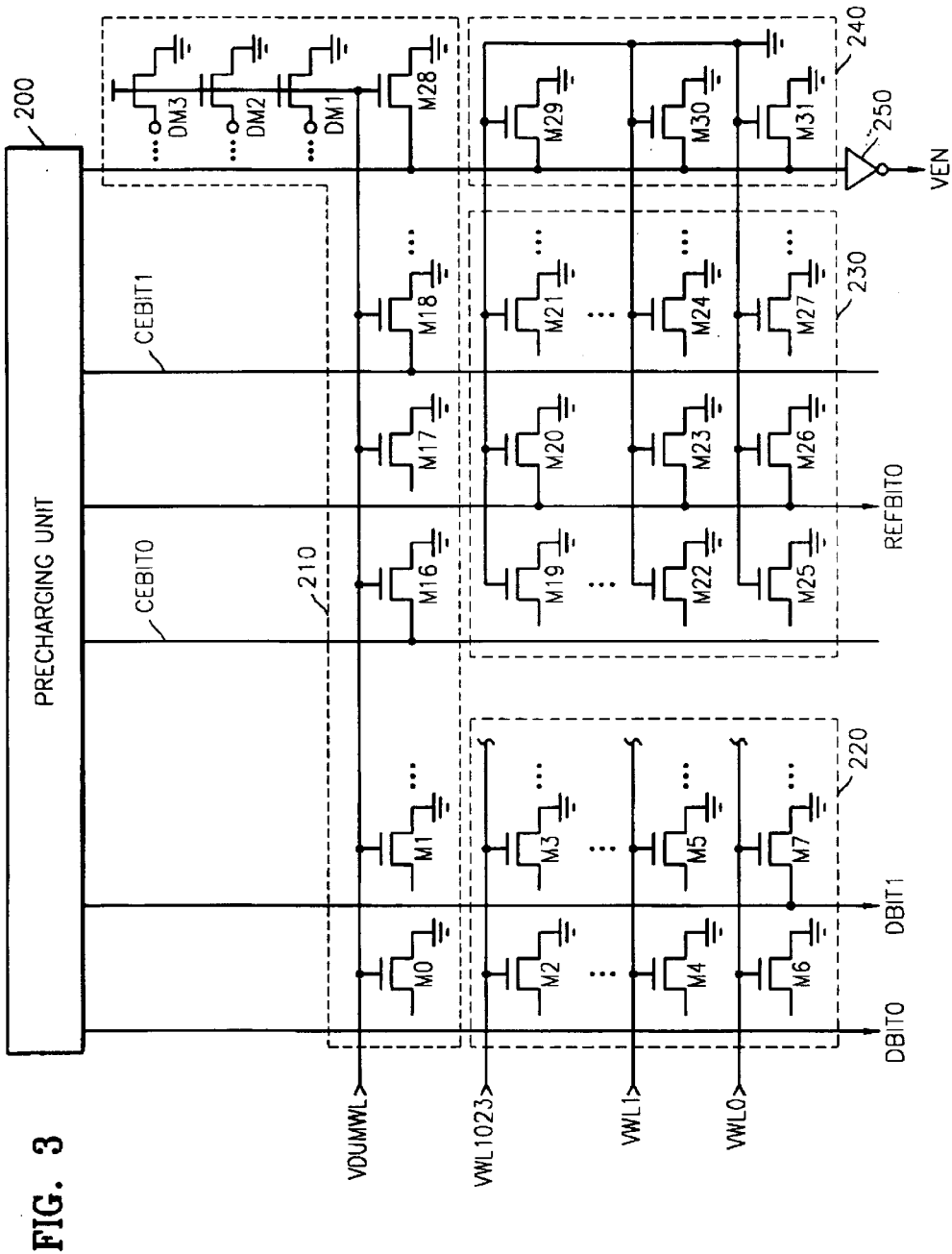
FIG. 3 is a circuit diagram illustrating the semiconductor memory device of FIG. 2 in greater detail, where the sense amplifying unit is excluded.
Figure 4:
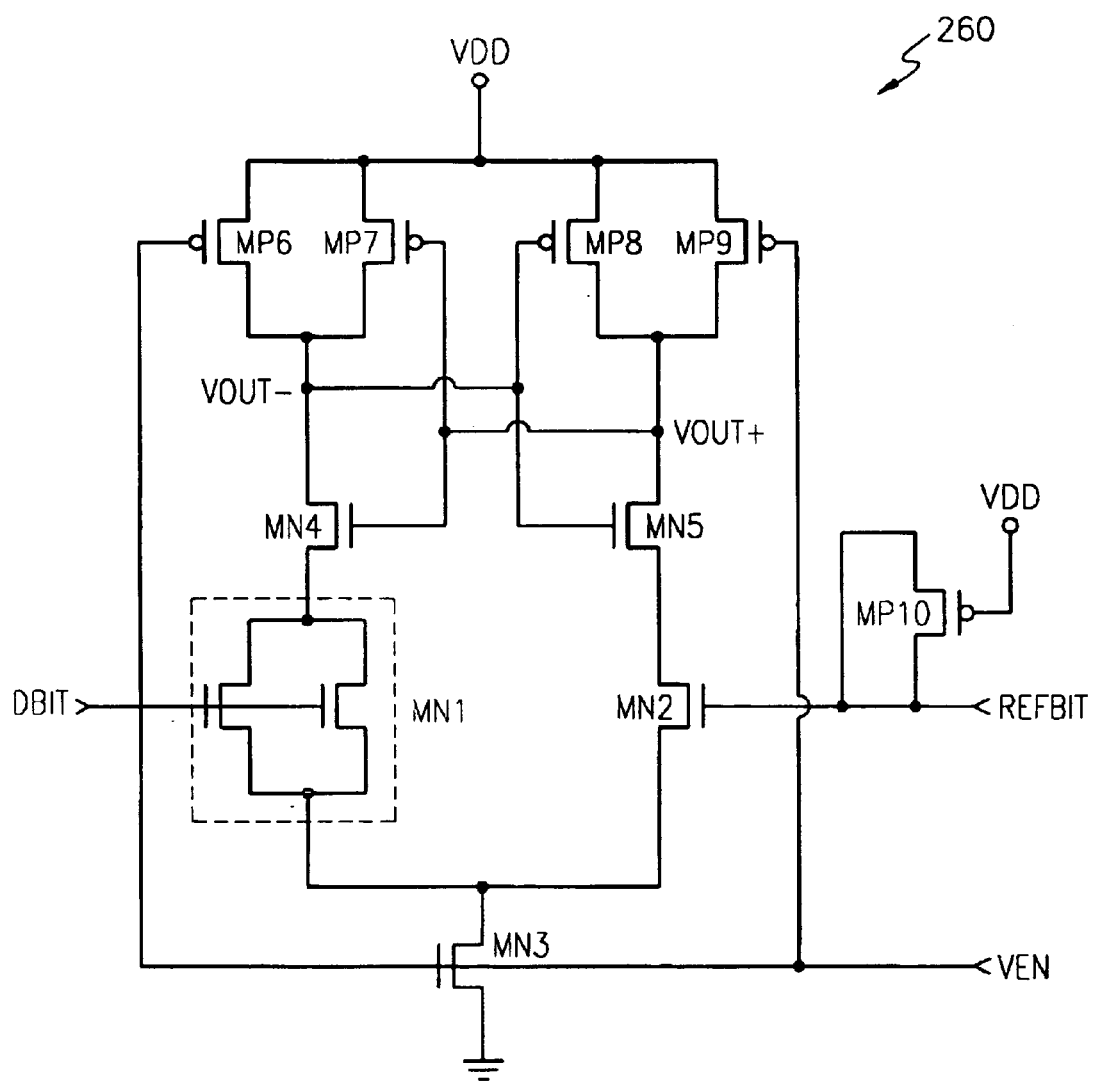
FIG. 4 is a circuit diagram of a sense amplifier of the sense amplifying unit of FIG. 2.

FIG. 2 is a block diagram of a semiconductor memory device with a capacity of 1 M (1024×1024) according to an exemplary embodiment of the present invention. FIG. 3 is a circuit diagram illustrating the semiconductor memory device of FIG. 2 in greater detail, where the sense amplifying unit is excluded. FIG. 4 is a circuit diagram of a sense amplifier of the sense amplifying unit of FIG. 2. FIGS. 2–4 will be occasionally referenced to for the following discussion.

Referring to FIGS. 2 and 3, an exemplary semiconductor memory device includes a precharging unit 200. Before reading data from bit cells, the precharging unit 200 uses a precharge voltage to charge the following lines: (i) a plurality of bit lines for bit cell data DBIT0, DBIT1, etc, (ii) a plurality of reference lines for reference signals REFBIT0, etc., (iii) a plurality of discharge lines for discharge signals CEBIT0, CEBIT1, etc., and (iv) an enable line to which the drain of a metal-oxide semiconductor field effect transistor (MOSFET) M28 in a dummy word line unit 210 is coupled. The precharge voltage may be a power supply voltage representing a second logic state "1".

In the dummy word line unit 210, MOSFETs M16, M18, and M28, which are turned on when a dummy word line signal VDUMWL is activated from a first logic state to the second logic state, discharge the discharge lines for discharge signals CEBIT0, CEBIT1, . . . , and the enable line to which the drain of MOSFET M28 is coupled, to the first logic state. The turned-on MOSFETs that discharge the enable line to the first logic state include dummy MOSFETs DM1 through DM3, which are in an "on" state and have grounded sources. The dummy MOSFETs DM1–DM3 increase the current driving capability of the turned-on MOSFETs when their drains are coupled to the enable line. This may be done using a replacement of a metal mask during fabrication of the semiconductor device. The replacement metal mask may be a metal etch mask used to connect the sources and drains of MOSFETs to a metal line, such as the enable line that the drain of the MOSFET M28 is coupled to, during fabrication, for example.

The semiconductor memory device may also include a bit cell array unit 220. The bit cell array unit 220 may include MOSFETs M2, M3, M4, etc., for storing bit cell data DBIT0, DBIT1, for example. The MOSFETs M2–M4, . . . may be installed at intersections between the bit lines and a plurality of word lines for word line signals VWL0 through VWL1023, for example. The MOSFETs M2–M4, . . . may read bit cell data from the intersection between a word line (activated in response to an X-address signal) and a bit line (selected in response to an Y-address signal).

The semiconductor memory device also may include a sense amplifying unit 260. The read-out bit cell data DBIT0, DBIT1 may be supplied to the sense amplifying unit 260. In FIG. 2, DBIT denotes any of bit cell data DBIT0, DBIT1, etc. The X-address signal selects one of the word lines to provide an activated signal, e.g., a signal changed from a first logic state to a second logic state. The Y-address signal selects one of the bit lines to receive outgoing bit cell data.

The gates of the MOSFETs M2, M3, . . . in bit cell array unit 220, are coupled to the word lines, and the sources a may receive a static ground voltage. The bit cells may store the first logic state when the drains are coupled to the bit lines, and otherwise store the second logic state when the drains are not connected to the bit lines.

The semiconductor memory device may also include a reference cell array unit 230. In the reference cell array unit 230, the reference lines (for reference signals REFBIT) alternate with discharge lines (for discharge signals CEBIT0, CEBIT1). Turned-off MOSFETs M20, M23, M26, etc., may be installed at intersections between the reference lines and a plurality of grounded gate lines that are coupled to gates of MOSFETs M19, M20, M21, M29, etc. Turned-off MOSFETs M19, M22, M25, M21, M24, M27, etc. are installed at intersections between the discharge lines and the grounded gate lines. The reference cell array unit 230 outputs the precharge voltage (as the reference signal REFBIT0). The precharge voltage is charged at a reference line and selected in response to the Y-address signal.

The reference lines may be arranged so as to be separated by an interval of 128 or 64 bit lines, for example, although other intervals are foreseen by the exemplary embodiments. Accordingly, a reference line corresponding to each selected bit line exists. For example, in the exemplary 1 M (1024× 1024) ROM of FIG. 3, if the reference lines are separated at intervals of 128 bit lines, 8 reference signals REFBIT0 through REFBIT7 are output from the reference lines. Hereinafter, for reasons of brevity, REFBIT is used to represent any of the reference signals REFBIT0 through REFBIT7.

Gates of the turned-off MOSFETs M20, M23, M26 may be coupled to the gate lines, the sources may receive a static ground voltage, and the drains may be coupled to the reference lines, as shown in FIG. 3 Gates of turned-off MOSFETs M19, M22, M25, M21, M24, M27, etc, may be coupled to the gate lines, sources provided with a static ground voltage, and drains that are open.

The drains of the turned-off MOSFETs M20, M23, M26, are coupled to the reference lines is to account for a worst case scenario in which leakage current reaches a maximum. In other words, if bit cell data "1" is selected to be read out from a MOSFET, the drains of MOSFETs (other than the MOSFET coupled to a bit line selected to transfer the selected bit cell data "1"), generate a maximum leakage current. The drains of the turned-off MOSFETs M19, M22, M25, M21, M24, M27, are open is to account for a worst case scenario in which, when adjacent bit lines other than a selected bit line are discharged to a first logic state, the selected bit line outputs unstable bit cell data, due to a coupling effect, at a voltage smaller than the voltage for ideal data "1". Consequently, even in this worst case, the reference cell array unit 230 may output a precharge voltage (as REFBIT0) in which the coupling effect and an influence of an "off" current have been reflected. This prevents the voltage of the reference signal from exceeding the voltage of bit cell data "1".

When the leakage current and the coupling effect increase, bit cell data DBIT "1" is smaller than ideal data "1" (as will be discussed further with regard to FIG. 6), and the reference signal REFBIT (in which the leakage current and the coupling effect have been reflected (as described above)), is also smaller than the ideal data "1". However, in the coupling structure of reference cell array unit 230, the case where the reference signal REFBIT is greater than the bit cell data DBIT "1" may not exist. Accordingly, the sense amplifying unit 260 compares the bit cell data DBIT "1" with the reference signal REFBIT, both of which are output under an identical condition. As previously described above, if the bit cell data DBIT is "0", the sense amplifying unit 260 compares the bit cell data DBIT "0" with the reference signal REFBIT.

The semiconductor memory device may also include a bit cell replica array unit 240. As shown in FIG. 3, in the bit cell replica array unit 240, turned-off MOSFETs M29, M30, and M31 may be installed at intersections between the enable line (to which the drain of MOSFET M28 is coupled) and the grounded gate lines that are coupled to the gates of the MOSFETs M19, M20, M21, M29, etc. The bit cell replica array unit 240 outputs the state of the signal transferred by the enable line. The gates of the turned-off MOSFETs M29, M30, and M31 are coupled to the gate lines, the sources provided with a static ground voltage, and the drains are coupled to the enable line that the drain of MOSFET M28 is coupled.

The turned-off MOSFETs M29, M30, and M31 are installed as described above in order to ensure that a certain degree of delay is reflected in a rising transition of an enable signal VEN by reflection of the junction capacitances of the drains of the MOSFETs M29, M30, and M31. This enables the delay of the enable signal VEN to be balanced with the delays of the word line signals VWL0 through VWL1023, as well as with the delay of the dummy word line signal VDUMWL.

The semiconductor memory device may also include a enable signal generation unit 250. The enable signal generation unit 250 checks the state of a signal (transferred to the enable signal) which the drain of MOSFET M28 is coupled to, and outputs the enable signal VEN. The enable signal VEN is activated from the first logic state to the second logic state when the dummy word line signal VDUMWL is activated. The enable signal generation unit 250 may be configured as an inverter, for example.

Referring now to FIG. 4, the sense amplifying unit 260 may be configured as a differential amplifier which receives input signals DBIT and REFBIT via MOSFET gates, i.e., the gates of MOSFETs MN1 and MN2. When the enable signal VEN is activated, MOSFETs MP6 and MP9 enter into an off state, and MOSFET MN3 enters into an on state, so that MOSFETs MP7, MP8, MN4, and MN5 operate. Hence, the sense amplifying unit 260 senses the read-out bit cell data DBIT, compares DBIT with the reference signal REFBIT, and outputs a (VOUT+)–(VOUT–) having a logic state corresponding to the read-out bit cell data DBIT as an output signal. In other words, when the read-out bit cell data DBIT has been stored as "1", the sense amplifying unit 260 outputs (VOUT+)–(VOUT–) having a second logic state. On the other hand, when the read-out bit cell data DBIT has been stored as "0", the sense amplifying unit 260 outputs (VOUT+)–(VOUT–) having a first logic state.

The differential amplifier of FIG. 4 may be an asymmetric sense amplifier in which the current driving capability of the MOSFET MN1 (which receives the read-out bit cell data DBIT) is different from that of the MOSFET MN2 (which receives the reference signal REFBIT). For example, the current driving capability of MOSFET MN1 may be at least two or more times greater than that of the MOSFET MN2, although the current driving ability between MN1 and MN2 may differ by other divisions or factors than 2 or more times. In this particular example, the variance in current driving capability may be achieved by making the channel width of the MOSFET MN1 at least two or more times greater than that of the MOSFET MN2, given equal channel lengths for MN1 and MN2.

The MOSFETs described in the dummy word line unit 210, the bit cell array unit 220, the reference cell array unit 230, and the bit cell replica array unit 240, and the dummy MOSFETs may have an identical channel width and an identical channel length.

In FIG. 4, the gate of the MOSFET MN2 may be prevented from overshooting a voltage of the second logic state, VDD by MOSFET MP10. This is because the source and drain of MOSFET MP10 are coupled to the gate of the MOSFET MN2, and the gate is coupled to a power supply which supplies the second logic state voltage VDD. Thus, any malfunction due to an increase in the current of MN2 may be substantially prevented.

Figure 5:
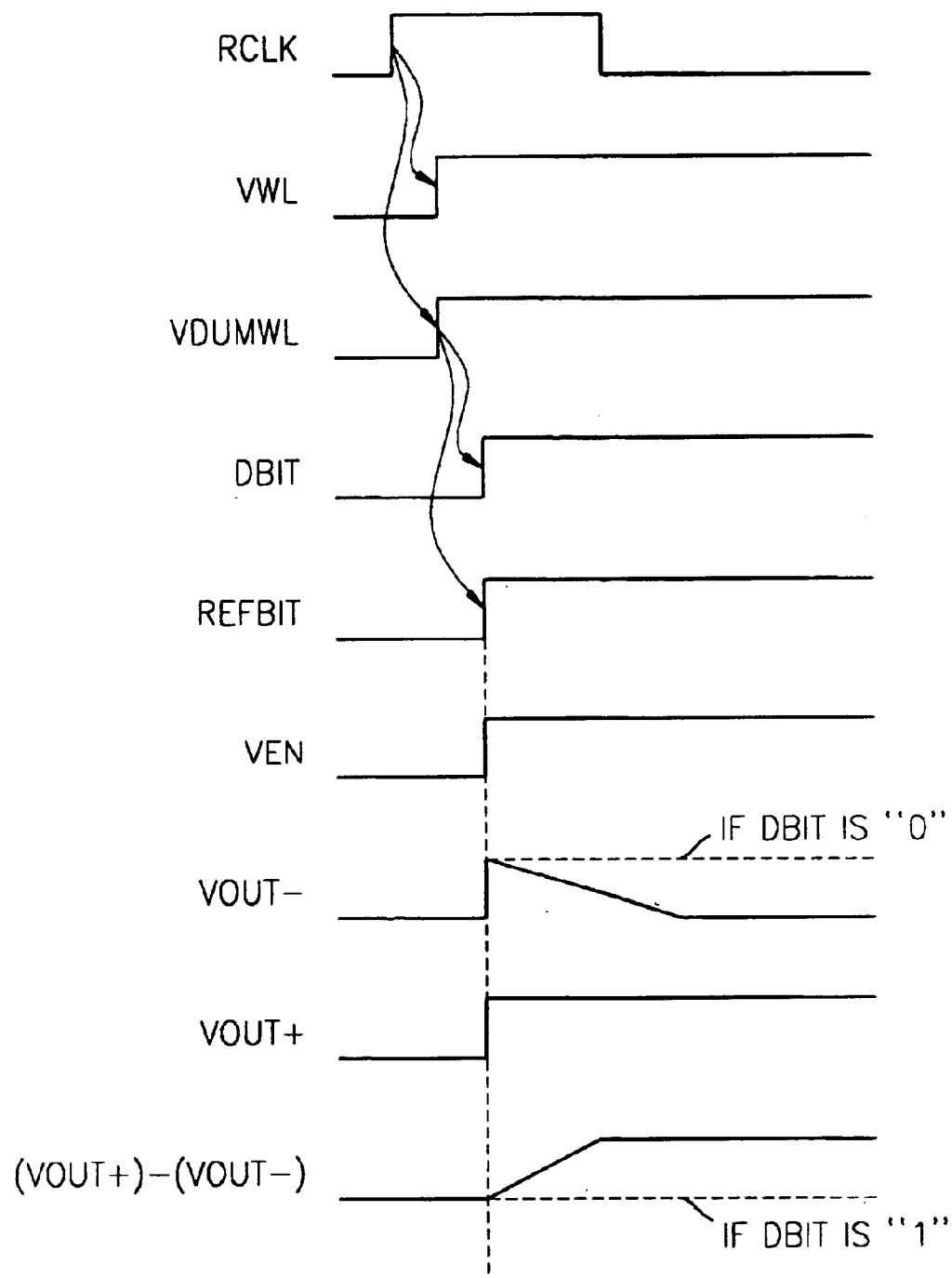
FIG. 5 is a timing diagram for illustrating operations of the circuits of FIGS. 3 and 4.

FIG. 5 is a timing diagram for illustrating operations of the circuits of FIGS. 3 and 4. Referring to FIG. 5, if bit cell data is read from the semiconductor memory device of FIG. 3, a data read clock signal RCLK is activated from a first logic state to a second logic state. Accordingly, a word line signal VWL and the dummy word line signal VDUMWL are activated from the first logic state to the second logic state in response to incoming X- and Y-address signals. Here, VWL may denote any of the word line signals VWL0 through VWL1023.

In response to the enable signal VEN activated from the first logic state to the second logic state, the sense amplifying unit 260 senses the read-out bit cell data DBIT read from the bit lines and the reference signal REFBIT output from the reference lines and outputs the output signal (VOUT+) –(VOUT–) having a logic state corresponding to the read-out bit cell data DBIT. If the read-out bit cell data has been stored as "1", the signal VOUT– gently decreases as shown in FIG. 5, because the MN1 has a channel width greater than the MN2. Consequently, a (VOUT+)–(VOUT–) value is output as the second logic state. On the other hand, if the read-out bit cell data has been stored as "0", a (VOUT+)–(VOUT–) value is output as the first logic state because there is no decrease in the signal VOUT–.

Figure 6:
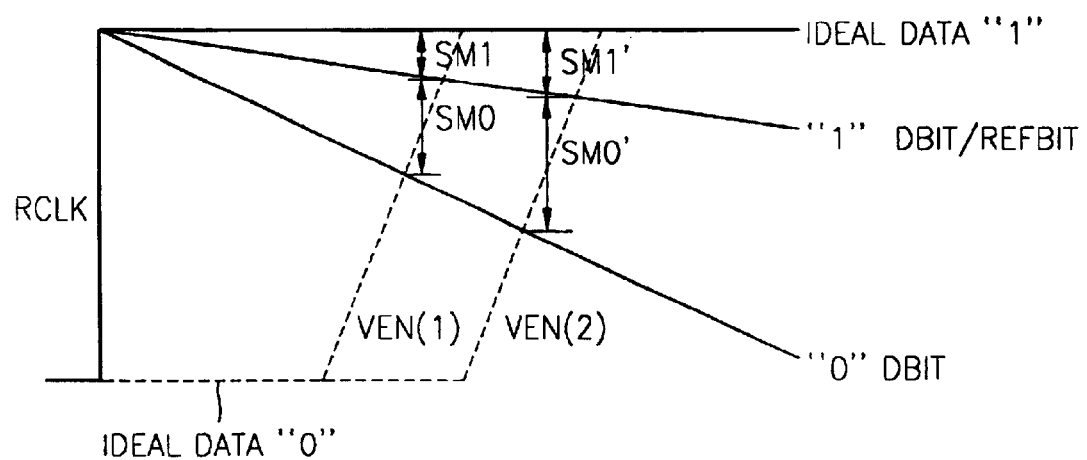
FIG. 6 is a diagram for illustrating a sensing operation of the sense amplifier of FIG. 4.

FIG. 6 is a diagram for illustrating a sensing operation of the sense amplifier of FIG. 4. Referring to FIG. 6, when the data read clock signal RCLK is activated from the first logic state to the second logic state, the enable signal VEN is slightly delayed and then activated from the first logic state to the second logic state. As described above and shown in FIG. 6, data cell data DBIT "1" (obtained when the leakage current and the coupling effect are maximum is smaller than ideal data "1"), and the reference signal REFBIT, (in which the leakage current and the coupling effect have been reflected due to the coupling structure of the MOSFETs in reference cell array unit 230), is also smaller than the ideal data "1".

In other words, the voltage of the bit cell data DBIT "1" obtained when the leakage current and the coupling effect are at a maximum, is (a) greater than the voltage of data obtained in a worst case, in which the current leakage and the coupling effect are maximum; but (b) smaller than the voltage of the ideal data "1". The voltage of the reference signal REFBIT is the voltage of data obtained in the worst case. Hence, as shown in FIG. 6, the bit cell data DBIT "1" and the reference signal REFBIT have a margin SM1 (or SM1') with respect to the ideal data "1" and a margin SM0 (or SM0') with respect to the bit cell data "0". In FIG. 6, a solid line for the bit cell data DBIT "0" illustrates a discharge of the bit cell data "0" from the precharge voltage to the first logic state.

The rising transition speed of an enable signal VEN, which is input to a sense amplifier, may vary according to the operational characteristics of MOSFETs included in a semiconductor memory device. In other words, the speed of the semiconductor memory device can be increased by coupling the drains of the dummy MOSFETs DM1 through DM3 to the enable line that the drain of the MOSFET M28 is coupled to, using only a replacement of a metal etch mask as described above. As shown in FIG. 6, in the case where the dummy MOSFETs DM1 through DM3 are open, an enable signal VEN(2) rises after a long delay from the data read clock signal RCLK. However, in the case where the drains of the dummy MOSFETs DM1 through DM3 are coupled to the enable line, the enable signal VEN(1) rises after a short delay from the data read clock signal RCLK. In this case, the margins SM1 and SM0 for VEN(1) are smaller than the margins (SM1' and SM0') for VEN(2).

As described above, the semiconductor memory device of FIG. 3 includes the dummy word line unit 210 to discharge the discharge lines CEBIT0, CEBIT1, etc. and the enable line to which the drain of the MOSFET M28 is coupled, to the first logic state. Upon reading of bit cell data, the discharge lines CEBIT0, CEBIT1, etc., and the enable line to which the drain of the MOSFET M28 is coupled are discharged to the first logic state by using the MOSFETs M16, M18, ..., and M28 of the dummy word line unit 210. MOSFETs M16, M18, ..., and M28 are turned on when the dummy word line signal VDUMWL is activated. The reference cell array unit 230 outputs (as the reference signal REFBIT0, for example) a precharge voltage that charges the reference signal selected in response to the Y-address signal. When the enable signal VEN is activated, the sense amplification unit 260 compares the bit cell data read-out by the bit cell array unit 220 with the reference signal REFBIT0 and outputs a logic state corresponding to the read-out bit cell data. The rising transition speed of the enable signal VEN can be increased by the dummy MOSFETs DM1 through DM3, so that the semiconductor memory device, and/or a system employing the semiconductor memory device, operates faster. Upon reading of bit cell data, the MOSFETs in reference cell array unit 230 and in bit cell array unit 240 maintain an off state, so that the number of MOSFETs actually operating may be substantially reduced as compared to conventional memory devices.

Thus, in a semiconductor memory device according to the exemplary embodiments of the present invention, a sense amplifier compares bit cell data based on actual grounding with a reference signal obtained by reflecting a coupling effect and reflecting an influence of an off current in a precharge voltage. Accordingly, the number of transistors operating upon data reading may be reduced, mitigating or eliminating the influence of process variations. Therefore a reference signal may remain stable even when transistors are providing poor uniformity, so that data may be properly read out from bit cells using a sense amplifier, for example. This may substantially reduce or prevent the generation of data reading errors.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed is:

1. A semiconductor memory device, comprising:
   a precharging unit for charging a plurality of bit lines, a plurality of reference lines, a plurality of discharge lines and an enable line;
   a dummy word line unit for discharging the discharge lines and the enable line to a first logic state;
   a bit cell array unit for storing bit cell data and for reading out the stored bit cell data;
   a reference cell array unit for outputting a precharge voltage to charge a selected reference line;
   a bit cell replica array unit for outputting the state of a signal transferred to the enable line;
   an enable signal generation unit for checking the state of the enable signal and for outputting an enable signal; and
   a sense amplifying unit for sensing the read-out bit cell data when the enable signal is activated, for comparing the read-out bit cell data with the reference signal, and for outputting a logic state corresponding to the read-out bit cell data.

2. The device of claim 1, wherein the precharging unit employs a precharge voltage to charge the bit lines, reference lines, discharge lines and enable line prior to the bit cell array unit reading out data from the bit cells.

3. The device of claim 1, wherein the dummy word line unit includes a plurality of metal-oxide semiconductor field-effect transistors (MOSFETs) that are turned on when a dummy word line signal is activated from the first logic state to a second logic state for discharging the discharge lines and enable line.

4. The device of claim 3, wherein the enable signal generation unit outputs the enable signal when the dummy word line signal is activated from the first logic state to the second logic state, the enable signal activated from the first logic state to the second logic state.

5. The device of claim 3, wherein
   the turned-on MOSFETs of the dummy word line unit further include a plurality of turned-on dummy MOSFETs, and
   the dummy MOSFETs include grounded sources and drains that are coupled to the enable line via a replacement metal mask that is formed during fabrication of the device, thereby increasing the capability of driving current.

6. The device of claim 5, wherein the MOSFETs and dummy MOSFETs have an identical channel width and an identical channel length.

7. The device of claim 1, wherein
   the bit cell array unit includes a plurality of MOSFETs for storing the bit cell data, and
   the MOSFETs are installed at intersections between the bit lines and the word lines for reading out bit cell data stored at an intersection between a word line that is activated in response to an X-address signal, and a bit line that is selected in response to a Y-address signal.

8. The device of claim 7, wherein the MOSFETs of the bit cell array unit have gates coupled to the word lines, sources provided with a static ground voltage, and drains that are coupled to the bit lines for storing the first logic state, or not coupled to the bit lines for storing the second logic state.

9. The device of claim 7, wherein the reference cell array unit further includes:
the reference lines and discharge lines, which are arranged in a repeating pattern of a discharge line bounded on either side by a reference line,
a plurality of turned-off MOSFETs that are installed at intersections between the reference lines and a plurality of grounded gate lines,
a plurality of turned-off MOSFETs installed at intersections between the discharge lines and the grounded gate lines, and
the precharge voltage used to charge the selected reference line is a reference signal selected based on the Y-address signal.

10. The device of claim 9, wherein the turned-off MOSFETs installed at the intersections between the reference lines and the grounded gate lines have gates coupled to the gate lines, sources provided with a static ground voltage, and drains coupled to the reference lines.

11. The device of claim 9, wherein the turned-off MOSFETs installed at the intersections between the discharge lines and the grounded gate lines have gates coupled to the gate lines, sources provided with a static ground voltage, and drains not coupled to the reference lines.

12. The device of claim 1, wherein the bit cell replica array unit includes a plurality of turned-off MOSFETs that are installed at intersections between the enable line and the grounded gate lines for outputting the state of a signal transferred to the enable line.

13. The semiconductor memory device of claim 12, wherein the turned-off MOSFETs installed at the intersections between the enable line and grounded gate lines have gates coupled to the gate lines, sources provided with a static ground voltage, and drains coupled to the enable line.

14. The device of claim 1, wherein
the precharge voltage for charging the selected reference line is a reference signal;
the device includes MOSFETS that receive read-out bit cell data and other MOSFETs that receive the reference signal;
the sense amplifying unit is a differential amplifier which receives input signals via gates of the MOSFETs, and
the current driving capability of MOSFETs that receive the read-out bit cell data is different from the current driving capability of MOSFETs that receive the reference signal.

15. A method of reading data from a semiconductor memory device, comprising:

charging a plurality of bit lines, a plurality of reference lines, a plurality of discharge lines and an enable line;
discharging the discharge lines and enable line to a first logic state based on a dummy word line signal being activated from the first logic state to a second logic state;
reading out bit cell data that is stored at intersections between a word line activated in response to an X-address signal and a bit line selected in response to a Y-address signal;
outputting, as a reference signal, a precharge voltage for charging a reference line that is selected based on the Y-address signal;
outputting the state of a signal transferred by the enable line;
checking the state of the enable signal to output the enable signal when the dummy word line signal is activated;
sensing the read-out bit cell data when the enable signal is activated;
comparing the read-out bit cell data with the reference signal; and
outputting a logic state corresponding to the read-out bit cell data.

16. A method of reading data from a semiconductor memory device, comprising:
generating a data read clock signal from a first logic state to a second logic state;
reading out bit cell data from a plurality of bit lines based on the generated data read clock signal;
activating a word line signal and a dummy word line signal from the first logic state to the second logic state based on incoming X-address signals and Y-address signals;
outputting an enable signal based on the activated dummy word signal;
sensing the read-out bit cell data and a reference signal based on the activated enable signal;
outputting one of a high logic state and a low logic state based on the sensed read-out bit cell data and sensed reference signal.

17. The method of claim 16, wherein
the X-address signal enables selection of one of the word lines to provide an activated signal change from the first logic state to the second logic state, and
wherein the Y-address signal enables selection of one of the bit lines to receive outgoing bit cell data.

18. The method of claim 17, wherein the reference signal is embodied as a precharge voltage for charging a reference line that is selected based on the Y-address signal.

19. A semiconductor memory device adapted to have data read therefrom in accordance with the method of claim 15.

20. A semiconductor memory device adapted to have data read therefrom in accordance with the method of claim 16.

* * * * *